United States Patent
Rohleder et al.

(10) Patent No.: US 9,665,421 B2
(45) Date of Patent: May 30, 2017

(54) SAFE SECURE BIT STORAGE WITH VALIDATION

(71) Applicants: Michael Rohleder, Unterschleissheim (DE); Stefan Doll, Munich (DE); Peter Limmer, Munich (DE)

(72) Inventors: Michael Rohleder, Unterschleissheim (DE); Stefan Doll, Munich (DE); Peter Limmer, Munich (DE)

(73) Assignee: NXP USA, Inc., Austin, TX (US)

( * ) Notice: Subject to any disclaimer, the term of this patent is extended or adjusted under 35 U.S.C. 154(b) by 9 days.

(21) Appl. No.: 14/841,970

(22) Filed: Sep. 1, 2015

(65) Prior Publication Data

US 2017/0060669 A1 Mar. 2, 2017

(51) Int. Cl.
*H04L 29/06* (2006.01)
*G06F 11/07* (2006.01)
*H03K 19/20* (2006.01)

(52) U.S. Cl.
CPC ........ *G06F 11/0793* (2013.01); *G06F 11/079* (2013.01); *G06F 11/0727* (2013.01); *H03K 19/20* (2013.01)

(58) Field of Classification Search
CPC ............. G06F 11/0793; G06F 11/0727; G06F 11/079; H03K 19/20
USPC ........................................................ 726/34
See application file for complete search history.

(56) References Cited

U.S. PATENT DOCUMENTS

| 3,900,741 A | 8/1975 | Fletcher et al. |
| 5,031,180 A | 7/1991 | McIver et al. |
| 6,025,946 A * | 2/2000 | Miyamori ........... H04L 25/4904 375/279 |
| 6,718,474 B1 * | 4/2004 | Somers ..................... G06F 1/08 713/322 |

FOREIGN PATENT DOCUMENTS

WO 96/11439 A1 4/1996

OTHER PUBLICATIONS

Skorobogatov, S. et al., "Optical Fault Induction Attacks," International Workshop on Cryptographic Hardware and Embedded Systems; Springer Berlin Heidelberg, 2002; <<www.cs.jhu.edu/~astubbl/600.4121s-c-papers/fault.pdf>>, 7 pages.
(Continued)

*Primary Examiner* — Michael S McNally (57) ABSTRACT

A bit storage device, integrated circuit, and method are provided. The bit storage device comprises registers to store an actual value, an inverse value, a differential actual value, and a differential inverse value, a validation circuit including validation inputs coupled to outputs of the registers and including a validity output to provide a validity indication, and a write circuit including write circuit inputs coupled to the registers, the write circuit configured to cause, at a first clock edge, the first register to store the actual value and either the second register to store the inverse value or the fourth register to store the differential inverse value, and, at a second clock edge, the third register to store the differential actual value and the other of the second register and the fourth register to store to store the inverse value or the differential inverse value, respectively.

20 Claims, 7 Drawing Sheets

(56) References Cited

OTHER PUBLICATIONS

Masuda Masaki et al: "A 65 nm Low-Power Adaptive-Coupling Redundant Flip-Flop", IEEE Transactions on Nuclear Science, New York. NY. U.S., vol. 60. No. 4. Aug. 4, 2013, pp. 2750-2755.
Kia S M et al:"Designs for Self Checking Flip-Flops"IEEE Proceedings: Computers and Digital Techniques, IEEE GB, vol. 145. No. 2, Mar. 23, 1998, pp. 81-88.

* cited by examiner

SAFE SECURE BIT STORAGE WITH VALIDATION

BACKGROUND

Field of the Disclosure

The present application relates generally to information storage devices and more particularly to a bit storage device with improved security.

Background of the Disclosure

Digital semiconductor devices typically rely on key storage elements which hold important decision criteria. This might be a flag signaling 'device secured' or 'functionality locked' or any kind of similar information that is of key importance for a secure system. There might be only one, a few or several dozens of such items, but in any case the protection of those values must be a prime concern for any system implementing security aspects. If this cannot be accomplished, any other security mechanism will fall short, because those values will be the first point of attack for any attempt to break the device security.

Protection of such values has evolved gradually as flaws have been discovered and exploited and techniques have been developed to address those flaws, typically on an ad hoc basis. The lack of a robust solution has allowed the cycle to be perpetuated.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A bit storage device and method are provided, which can serve as a basic building block for any digital electronic systems to be secured against tampering and also for any digital electronic systems to be used in safety applications. To provide security against the myriads of possible attack scenarios (such as voltage attacks, tampering with clocks, clock ratios, etc.), countermeasures involving the redundant storage of information, enforced variability in value/time, and an assurance of no common point for attacks are implemented. A bit storage element for holding a single bit value (i.e. a "secured"/"unsecured" information) is described that provides a specific combination of those countermeasures against most known kinds of security attacks, either by inhibiting tampering or by indicating any illegal modification. To enable the usage of this element within a device intended for usage in a functional safety application (IEC61508, ISO26262), a level of error correction capability equal to at least that of a triple voting flip flop is provided. Such error connection capability can also help safeguard a security device, since the values recorded within such flip flops are often of prime importance for the device and should be safeguarded against accidental change.

From an external point of view, the proposed architecture can be substituted for a standard data (D) flip flop (FF) with a reset input to provide improved security and safety. The data input (In, Inb) and the data output (Out, Outb) use dual rail encoding to protect those signals. As used herein, the term dual rail encoding means two signal lines configured to redundantly convey a single bit value using one signal of one of the two signal lines and another signal of the other one of the two signal lines, wherein the second signal is inverted with respect to the first signal. A dual write pulse WP1, WP2 is used to control and protect writing. The clock (Clk) and reset input (Rb) are singular signals. However, the singular clock signal is used to generate distinct clock signals for internal use, and the operation in response to a reset signal at the reset input is defined to ensure a secure transition, as will be described in detail below. A validity indication is provided that signals the validity of the content. The validity indication can be provided in replicated form (e.g., Valid and Invalid outputs).

There are some features that can be provided by at least some embodiments of the proposed bit storage element to ensure its correct behavior and storage function in case of the most common security attack scenarios as well as in case of the usual hardware failures to be handled by a safety device. The content of such an element can be used to switch a portion or feature of the device from a secured to an unsecured state or vice-versa. Reset attacks are futile when defining the secure state as reset value. Any reset attack then results in entering the secure state. The clock system is hardened against clock attacks by usage of different, internal clocking schemes, which filters clock glitches and provides temporal differentiation of content updates. Redundant input is used to ensure that a proper differential input signal is supplied for correct storage of a new value. A specific write sequence using two differential enables respective write pulses inhibits external attempts to misuse the write operation to modify the content. Redundant outputs are used to provide a differential output signal reflecting the bit storage element content. The redundant outputs can be used to validate each other. Failure detection and correction capabilities equivalent to a triple-voting FF (TVF) are provided with continuous failure correction to inhibit failure accumulation, which can be useful, for example, as a safety feature. Continuous failure correction of the internal flip-flops and the freezing of invalid content prohibits any attempt to stepwise compromise the content of the internal flip-flops. For this purpose, complementary outputs signal the correctness of the provided output value. These outputs can be used, for example, by the system to qualify the provided output or to request an appropriate countermeasure by the system to protect against tampering attacks. Access by design-for-test (DFT) logic to the internal structures is not permitted to inhibit a possible loophole by this logic.

Figure 1:
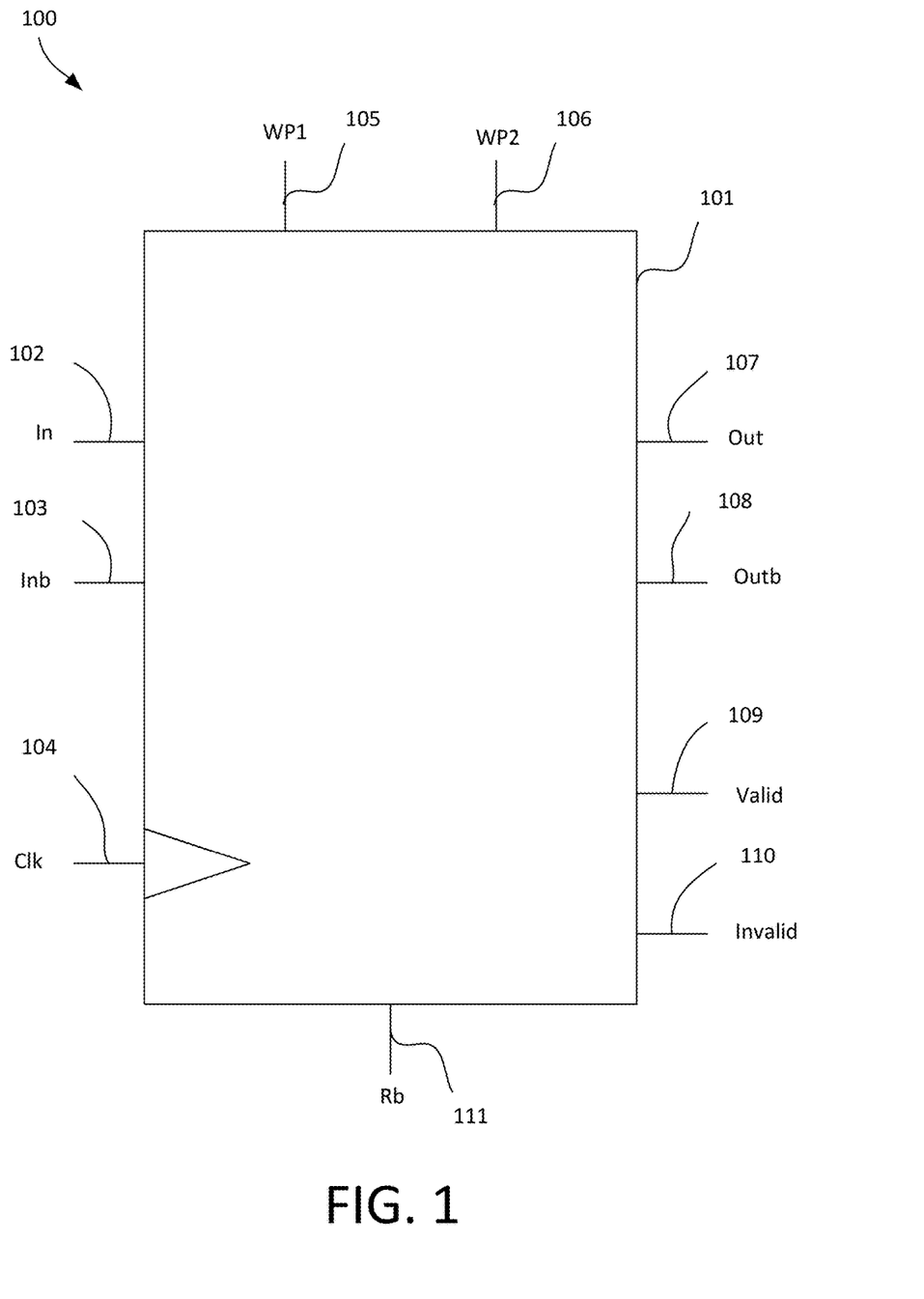
FIG. 1 is a block diagram illustrating a bit storage device in accordance with at least one embodiment.

FIG. 1 is a block diagram illustrating a bit storage device in accordance with at least one embodiment. A bit storage device system 100 comprises bit storage device 101 and its interconnects 102-111. Bit storage device 101 receives, as the data input of the bit storage device 101, redundant input lines comprising a non-inverted input line 102 (named IN) and an inverted input line 103 (named INB). Bit storage device 101 receives, as the clock input, clock line 104 (named Clk). Bit storage device 101 receives write pulse lines 105 (named WP1) and 106 (named WP2). Bit storage device 101 provides, as the data output of bit storage device 101, redundant output lines comprising a non-inverted output line 107 (named Out) and an inverted output line 108 (named Outb). Bit storage device 101 provides, as the validity indication, a validity line 109 (named Valid) and an invalidity line 110 (named Invalid). A reset line 111 (named Rb, indicating it is active at a low logic level) is provided to bit storage device to request a reset operation of the bit storage device 101.

Figure 2:
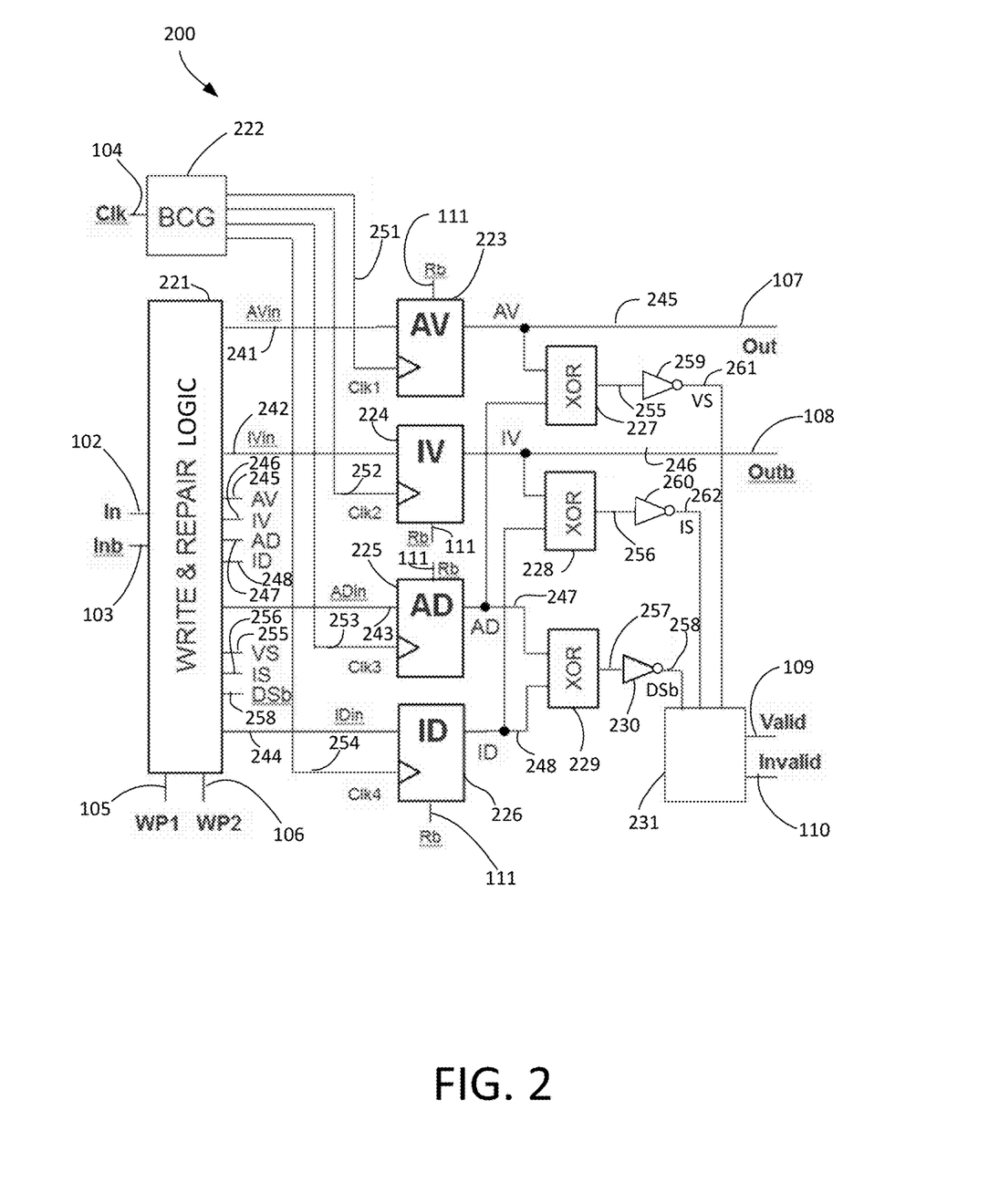
FIG. 2 is a schematic diagram illustrating a bit storage device in accordance with at least one embodiment.

FIG. 2 is a schematic diagram illustrating a bit storage device in accordance with at least one embodiment. Bit storage device 200 comprises write and repair logic circuit 221, basic clock generator (BCG) 222, first register 223, second register 224, third register 225, fourth register 226, first exclusive-OR (XOR) gate 227, followed by inverter 259 (wherein XOR gate 227 and inverter 259 may be considered to function together as what may be abbreviated as an XNOR gate), second XOR gate 228, followed by inverter 260 (wherein XOR gate 228 and inverter 260 may be considered together to form an XNOR gate), third XOR gate 229, followed by an inverter 230 (also together forming an XNOR gate), and validation logic block 231. Non-inverted input line 102 and inverted input line 103 are provided as data inputs to write and repair logic block 221. Write pulse lines 105 and 106 are provided as write pulse inputs to write and repair logic block 221. First register output 245 (named AV for actual value), second register output 246 (named IV for inverse value), third register output 247 (named AD for differential actual value), and fourth register output 248 (named ID for differential inverse value) are provided to write and repair logic 221. Inverter output 261 (named VS for actual value is the same), inverter output 262 (named IS for inverse value is the same), and inverter output 258 (named DSb for differential value is not the same; the b denotes 'active low' logic) are provided to write and repair logic 221. Inverter outputs 261, 262, and 258 may be considered to be XNOR function outputs based on the logic that results from inverters 259, 260, and 230 being coupled to the outputs of XOR gates 227, 228, and 229, respectively. Write and repair logic 221 provides as output lines actual value input line 241 (named AVin) to a data input of first register 223, inverse value input line 242 (named IVin) to a data input of second register 224, differential actual value input line 243 (named ADin) to a data input of third register 225, and differential inverse value input line 244 (named IDin) to a data input of fourth register 226.

An external clock signal is provided to BCG 222 at clock line 104. BCG 222 provides a first register clock line 251 to a clock input of first register 223, a second register clock line 252 to a clock input of second register 224, a third register clock line 253 to a clock input of third register 225, and a fourth register clock line 254 to a clock input of fourth register 226. A reset line 111 is provided to each of first register 223, second register 224, third register 225, and fourth register 226.

The output lines from write and repair logic 221 can provide values based on non-inverted input line 102 and inverted input line 103, for example, when write pulse lines 105 and 106 indicate that a value received from non-inverted input line 102 and a complementary value received from inverted input line 103 are to be written to bit storage device 200. The output lines from write and repair logic 221 can alternatively provide values based on at least a subset of the outputs of first register 223, second register 224, third register 225, and fourth register 226, for example, when write pulse lines 105 and 106 indicate that no new value is to be written to bit storage device 200. Thus, an existing value stored in bit storage device 200 may be rewritten to bit storage device 200. Accordingly, in one embodiment, the value stored in bit storage device 200 may be updated every full clock cycle of clock line 104, with either a new value or the existing value written to bit storage device 200 in accordance with values of write pulse lines 105 and 106. In another embodiment, a new value may be written to bit storage device 200 or the existing value may be simply retained in bit storage device 200 but not rewritten to bit storage device 200 in accordance with a values of write pulse lines 105 and 106. As used herein, an updated value refers to a value being written to bit storage device 200. Examples of updated values include an existing value stored in bit storage device 200, a repair value, such as a value provided by write and repair logic block 221 to correct an erroneous value stored in one of first register 223, second register 224, third register 225, and fourth register 226, and a new input value received via non-inverting input line 102 and inverting input line 103.

First register 223 stores and outputs via first register output 245 an actual value. Second register 224 stores and outputs via second register output 246 an inverse value, which is inverted with respect to the actual value. Third register 225 stores and outputs via third register output 247 a differential actual value, which has the value of the actual value but is written at a different time than the actual value. Fourth register 226 stores and outputs via fourth register output 248 a differential inverse value, which has the value of the inverse value but is written at a different time than the inverse value.

First register output 245 is provided as non-inverted output line 107. Second register output 246 is provided as inverted output line 108. First register output 245 is connected to a first input of first XOR gate 227. Third register output 247 is connected to a second input of first XOR gate 227. First XOR gate 227 provides output 255 to an input of inverter 259, which inverts output 255 to provide inverter output 261 (named VS to represent the actual value and the differential actual value being the same) to validation logic block 231. Second register output 246 is connected to a first input of second XOR gate 228. Fourth register output 248 is connected to a second input of second XOR gate 228. Second XOR gate 228 provides output 256 to an input of inverter 260, which inverts output 256 to provide inverter output 262 (named IS to represent the inverse value and the differential inverse value being the same) to validation logic block 231. Third register output 247 is connected to a first input of third XOR gate 229. Fourth register output 248 is connected to a second input of third XOR gate 229. Third XOR gate 229 provides output 257 (named DS to represent the differential actual value and the differential inverse value reflecting the same, differential internal value) to an input of inverter 230. Inverter 230 inverts the DS signal at output 257 to provide an inverter output 258 (named DSb to represent an active low indicating that the differential actual value is matching its inverse differential value) to an input of validation logic block 231. As noted above, inverter outputs 261, 262, and 258 may be considered to be XNOR function outputs, providing XNOR values with respect to the outputs of first register 223, second register 224, third register 225, and fourth register 226 to which XOR gates 227, 228, and 229 are coupled. Based on the VS, IS, and DSb signals provided to validation block 231, validation block 231 provides mutually exclusive outputs at validity line 109 and invalidity line 110 to indicate whether the combination of values stored in first register 223, second register 224, third register 225, and fourth register 226 validly represent a stored bit value. It is worth noting that the validity line 109 and the invalidity line 110 are not using dual-rail encoding; instead the validity line 109 is only asserted when the dual-rail encoded output Out, Outb reflects a valid value, and the invalidity line 110 is asserted whenever the internal logic has assumed an invalid state, thus indicating an invalid internal status. A concurrent assertion of both outputs is avoided, while both signals are de-asserted when an internal state is reached that is indeterminate; as this is the case when a modified state of an internal FF requires a repair operation, or when a write operations has been started but not successfully finished. This permits external logic to use the Valid/Invalid signal pair to qualify the output signal Out, Outb.

In one embodiment, XOR gates 227, 228, and 229, inverters 259, 260, and 230, and validation logic block 231 not only serve to validate values stored in first register 223, second register 224, third register 225, and fourth register 226, but also serve to validate the complementary nature of the dual rail encoded input value at non-inverted input line 102 and inverted input line 103 during a write operation. For example, by basing at least one of the values to be stored in at least one of first register 223, second register 224, third register 225, and fourth register 226 on what properly should be a non-inverted input value at non-inverted input line 102 and by basing at least one other of the values to be stored in at least one other of first register 223, second register 224, third register 225, and fourth register 226 on what properly should be an inverted input value at inverted input line 102, a situation where the values at non-inverted input line 102 and inverted input line 103 are improperly the same value can be detected by XOR gates 227, 228, and 229, inverters 259, 260, and 230, and validation logic block 231 based on propagation of the incorrect combination of input values to the values stored in first register 223, second register 224, third register 225, and fourth register 226. In another embodiment, validation of the input values at non-inverted input line 102 and inverted input line 103 may alternatively or supplementarily be provided by write and repair logic block 221.

The bit storage element comprises four internal flip-flops (FF), where a reset operation request a new state, reflecting a valid '0' or a valid '1' by connecting the Rb input to either the 'set' or 'dr' reset input of a particular FF, as shown below in Table 1. The effect of a reset operation is to reset the values of four internal flip-flops to a stored bit value representative of a secured state, which can be either a valid '1' or a valid '0'; as shown in Table 2.

TABLE 1

Internal flip flop values and the effect of a reset operation on them

| FF | Rb connection For valid '1' | Rb connection for valid '0' | Comment/Abbreviation |
|---|---|---|---|
| AV | set | clr | Actual Value |
| IV | clr | set | Inverse Value |
| AD | set | dr | Actual Value/Differential |
| ID | dr | set | Inverse Value/Differential |

Different variations of the reset operation can be performed to accommodate systems in which a binary zero value is used to represent a secured state of the system and systems in which a binary one value is used to represent a secured state of the system, as shown below in Table 2:

TABLE 2

Reset operations for different representations of a secured state

|  | AV | IV | AD | ID | Secure |
|---|---|---|---|---|---|
| Reset #1 | 0 | 1 | 0 | 1 | 0 |
| Reset #2 | 1 | 0 | 1 | 0 | 1 |

Internal logic is provided to determine the validity of the combination of values stored in the four internal flip flops, as shown below in Table 3. A validation logic block is used to generate a validation indication, which can include, for example, a Valid output and an Invalid output.

TABLE 3

Validation logic comparison inputs

| Signal | Comment/Abbreviation |
|---|---|
| VS | (Actual) Value Same; AV output matches AD output |
| IS | Inverse Value Same; IV output matches ID output |
| DSb | Differential Value not Same; AD is not inverse of ID, active low |

An active-low reset signal, Resetb, is connected to the Set/Reset input (Rb) of the internal FF's. The combination of values established by assertion of the reset signal is dependent on the secure state used in the system. For example, the secure state can be a stored bit value of 1, as represented by an internal FF value combination of 1010, as shown in FIG. 2.

A basic clock generator (BCG), which can be shared among multiple bit storage elements, provides clock signals for each of the four internal flip flops. A logic block is also provided for write and repair control.

The proposed architecture provides a specific and unique set of features with a minimum amount of logic. Any valid value change requires the change of two inverse encoded FF's (redundant storage, dual rail encoding) in two consecutive clock cycles, which is referred to as a "full clock cycle." An exception is a reset request, which results in the storage element entering the secure state.

Temporal diversity over two clock cycles (one "full clock cycle") is one of the countermeasures that protects against most tampering attacks. At any time only two of the four FF are allowed to validly change their value. Singular changes will be repaired, thus preventing the accumulation of erroneous changes. A valid write sequence is needed to cause a valid value change.

A valid write sequence requires at two clock cycles that two FF's change their value to an inverse state, provided by a dual rail input, controlled by a duplicate, inverse encoded write pulse. Any intermediate state can be recognized as illegal (by de-asserting the Valid output), so interfering by stopping clocks is not useful.

Inverse encoding at any time and usage of dual rail signals protect against any kind of voltage attack. There is no singular internal signal that could be used to alter the bit storage element's stored bit value.

Besides the exemplary structure described with respect to one embodiment, there are multiple variations of clock assignments and write sequences possible. Valid combinations are described below in more detail. Other variations possible are mostly related to the used strategy for clock and reset inputs. For example, the clocking system may be configured to use both clock edges. Such a variation may map a "full clock cycle" to a single clock cycle of the provided Clk input rather than two clock cycles of this input in length. As another example for an alternate implementation, the clocking system may be configured to use falling clock edges rather than rising clock edges. As yet another example, the polarity of reset inputs may be varied from what his shown.

A correct value is captured when both (VS AND IS) are 1 and DSb is 0. A single bit error that can be corrected has been detected when VS does not match IS (e.g., VS XOR IS is 1). Single bit errors are corrected within the next full cycle. The Valid signal Valid::=VS AND IS AND (NOT DSb) is de-asserted during a repair cycle (without asserting the Invalid signal). An invalid encoding that should not be corrected has been found when both VS and IS are 0 (indifferent DS) or when all three signals VS, IS, and DSb are 1; Invalid:=(VS AND IS AND DSb) OR (NOT(VS AND IS)). Invalid encodings are not corrected to avoid further changes that could result in a valid, but not intended state.

TABLE 4

Possible internal register values, corresponding validation logic values, and their states as valid, invalid, or correctably erroneous.

| AV | IV | AD | ID | VS | IS | DSb | Comment |
|---|---|---|---|---|---|---|---|
| 0 | 1 | 0 | 1 | 1 | 1 | 0 | Valid '0' encoding |
| 1 | 0 | 1 | 0 | 1 | 1 | 0 | Valid '1' encoding |
| 0→1 | 1 | 0 | 1 | 0 | 1 | 0 | Bit flip AV |
| 1→0 | 0 | 1 | 0 | 0 | 1 | 0 | Bit flip AV |
| 0 | 1→0 | 0 | 1 | 1 | 0 | 0 | Bit flip IV |
| 1 | 0→1 | 1 | 0 | 1 | 0 | 0 | Bit flip IV |
| 0 | 1 | 0→1 | 1 | 1 | 0 | 1 | Bit flip AD |
| 1 | 0 | 1→0 | 0 | 0 | 1 | 1 | Bit flip AD |
| 0 | 1 | 0 | 1→0 | 1 | 0 | 1 | Bit flip ID |
| 1 | 0 | 1 | 0→1 | 1 | 0 | 1 | Bit flip ID |
| 0 | 0 | 0 | 0 | 1 | 1 | 1 | Invalid Status |
| 0 | 0 | 1 | 1 | 0 | 0 | 0 | Invalid Status, write indeterminate |
| 0 | 1 | 1 | 0 | 0 | 0 | 1 | Invalid Status, write indeterminate |
| 1 | 0 | 0 | 1 | 0 | 0 | 0 | Invalid Status, write indeterminate |
| 1 | 1 | 0 | 0 | 0 | 0 | 1 | Invalid Status, write indeterminate |
| 1 | 1 | 1 | 1 | 1 | 1 | 1 | Invalid Status |

Figure 3:
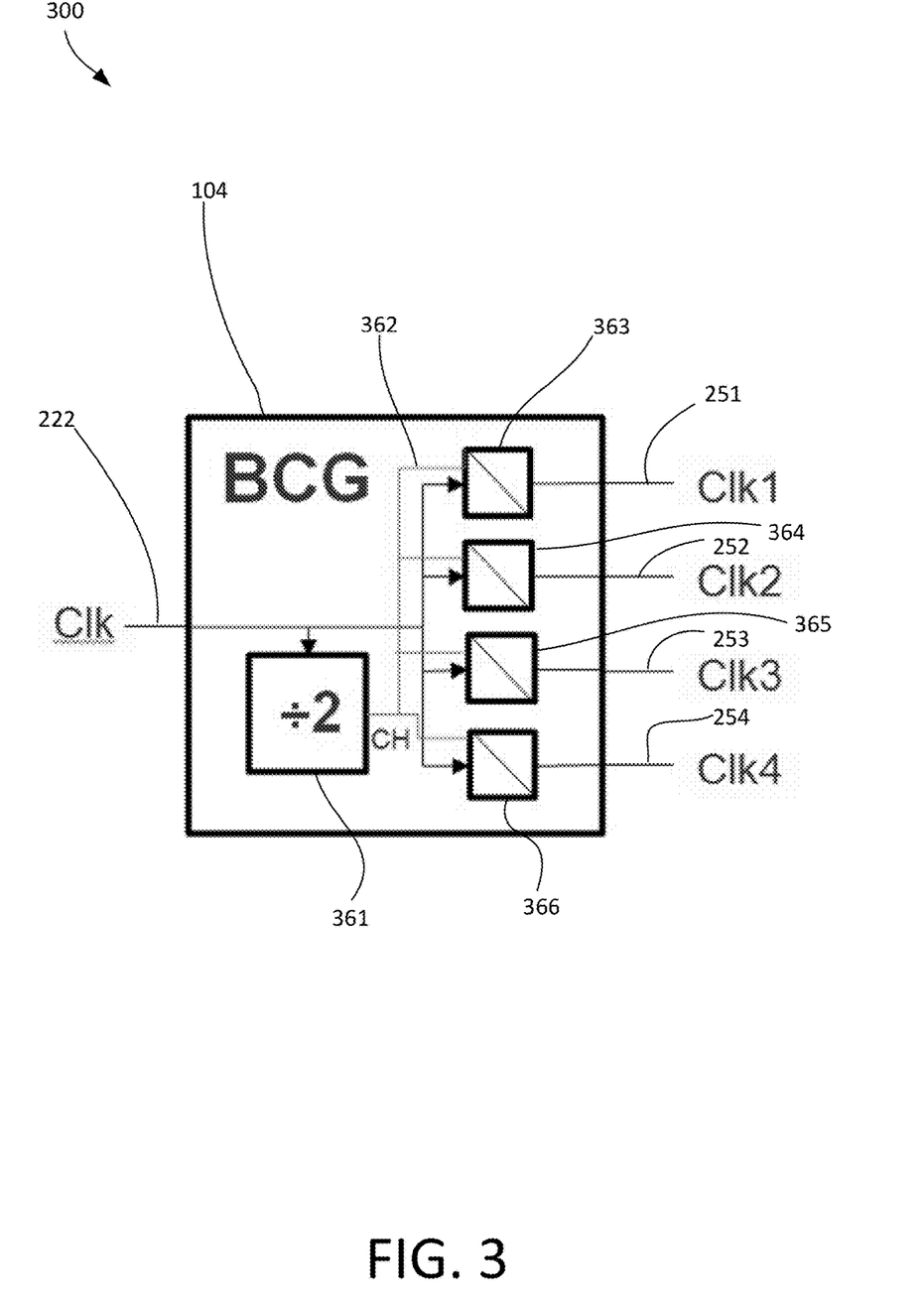
FIG. 3 is a block diagram illustrating a clock generator for a bit storage device in accordance with at least one embodiment.

FIG. 3 is a block diagram illustrating a clock generator for a bit storage device in accordance with at least one embodiment. Clock line 222 is connected to an input of basic clock generator (BCG) 104 and applies a clock signal named Clk as an input to clock divider block 361, first clock logic block 363, second clock logic block 364, third clock logic block 365, and fourth clock logic block 366. Clock divider block 361 divides the clock signal Clk received at clock line 222 by two to produce at clock line 362 a clock signal (named CH to denote half clock) with half the frequency of the clock signal Clk received at clock line 222. First clock logic block 363 uses clock signals Clk and CH to provide a first register clock signal to first register clock line 251. Second clock logic block 364 uses clock signals Clk and CH to provide a second register clock signal to second register clock line 252. Third clock logic block 365 uses clock signals Clk and CH to provide a third register clock signal to third register clock line 253. Fourth clock logic block 366 uses clock signals Clk and CH to provide a fourth register clock signal to fourth register clock line 254.

The proposed bit storage element is hardened against clock attacks by the use of clocking mechanisms that utilize several protective strategies. No direct usage is made of the provided base clock Clk. Instead, internal clocks (Clk1-Clk4) are generated and used. The internal clocks are derived from the base clock by clock gates that can filter many clock glitches. For this purpose, an internal clock phase signal CH is generated by a simple clock divider. All updates of the internal FF's are performed within a full cycle, which spans two Clk cycles. Each internal FF uses its own derived clock Clk1, Clk2, Clk3, Clk4, using different clocking schemes applied in either the first or the second half cycle of a full cycle, according to the following rules: At each half cycle, a value (AV,AD) and an inverted value (IV,ID) is being modified. At each half cycle, crossed pairs of FFs are operated using different clocking schemes.

Figure 4:
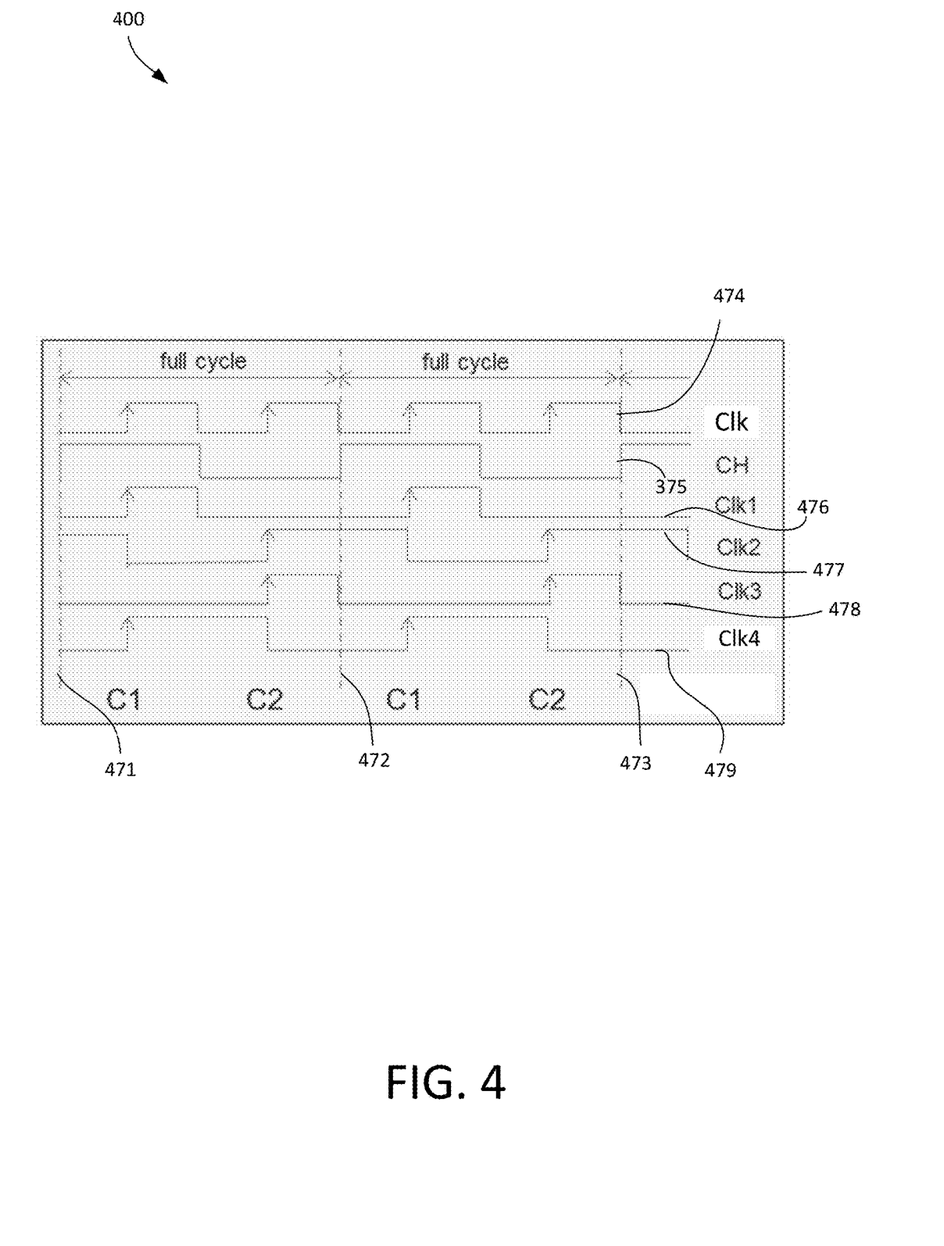
FIG. 4 is a timing diagram illustrating clock signals generated by the clock generator of FIG. 3 in accordance with at least one embodiment.

FIG. 4 is a timing diagram illustrating clock signals generated by the clock generator of FIG. 3 in accordance with at least one embodiment. Clock timing 400 relates clock signal Clk received at clock line 222, clock signal CH at clock line 362, a first register clock signal (denoted Clk1) at first register clock line 251, a second register clock signal (denoted Clk2) at second register clock line 252, a third register clock signal (denoted Clk3) at third register clock line 253, and a fourth register clock signal (denoted Clk4) at fourth register clock line 254. Clock signal Clk is shown as clock waveform 474. Clock signal CH is shown as clock waveform 375. First register clock signal Clk1 is shown as clock waveform 476. Second register clock signal Clk2 is shown as clock waveform 477. Third register clock signal Clk3 is shown as clock waveform 478. Fourth register clock signal Clk4 is shown as clock waveform 479.

One full clock cycle begins at time 471 with clock signal Clk at a low logic level, clock signal CH at a high logic level, clock signal Clk1 at a low logic level, clock signal Clk2 at a high logic level, clock signal Clk3 at a low logic level, and clock signal Clk4 at a low logic level. At a point C1 within the first full clock cycle, clock signals Clk, Clk1, and Clk4 change to a high logic, clock signal Clk2 changes to a low logic level, clock signal CH remains at a high logic level, and clock signal Clk3 remains at a low logic level. At a point halfway between points C1 and C2 in the first full clock cycle, Clock signals Clk, CH, and Clk1 change to a low logic level, clock signals Clk2 and Clk3 remain at a low logic level, and clock signal Clk4 remains at a high logic level. At point C2 within the first full clock cycle, clock signals Clk, Clk2, and Clk3 change to a high logic level, clock signal Clk4 changes to a low logic level, and clock signals CH and Clk1 remain at a low logic level. At time 472, which occurs at the end of the first full clock cycle and the beginning of a subsequent clock cycle, clock signal CH changes to a high logic level, clock signals Clk and Clk3 change to a low logic level, clock signals Clk1 and Clk4 remain at a low logic level, and clock signal Clk2 remains at a high logic level. The description of any preceding or subsequent full cycle replicates the preceding description as shown in FIG. 4 for a subsequent second full cycle.

An embodiment of the clocking scheme described herein may be in form, for example, of derived clocks where the clocks are generated by a "punch-out" scheme that eliminates every second clock of the base clock Clk for a particular result clock Clk1-Clk4, e.g., by applying the clock phase CH. A first clocking scheme CP1 has its edge during the first half cycle, and a second clocking scheme CP2 has its edge during the second half cycle.

Another embodiment of the clocking scheme described herein may be in form of half frequency clocks, i.e., by latching the value of the CH (or its inverted value) at every base clock Clk. This results in a first clock CE1 having its edge during the first half cycle, a second clock CE2 has its edge during the second half cycle of a full cycle.

TABLE 5

Clocking schemes

| scheme | Generation | time |
|---|---|---|
| CP1 | CLK and CH | C1 |
| CP2 | CLK and ~CH | C2 |
| CE1 | @clk, ≤CH | C1 |
| CE2 | @clk, ≤~CH | C2 |

There are multiple combinations of clock assignments for the derived clocks possible, based on the rules described above, resulting in two update sequences C#1 and C#2, as shown below in Table 6. Entries having the same value X or Y are occurring in the same half cycle, which is either the first or the second of a full cycle. Two sequences of update order (X→Y, Y→X) are therefore possible for both combinations, resulting in total four possibilities (cross product of <update order> and <update sequence>) for the following clocking assignments for every derived clock.

TABLE 6

Update clocking sequences C#1 and C#2

| clock | FF | C#1 | C#2 |
|---|---|---|---|
| Clk1 | AV | X | X |
| Clk2 | IV | X | Y |
| Clk3 | AD | Y | Y |
| Clk4 | ID | Y | X |

Table 7 below is an example that shows the four possible orders O#1-O#4 for a single combination C#2, X→Y. Similar possible order applies to the other three combinations.

TABLE 7

Possible orders O#1, O#2, O#3, O#4 for the clocking sequence C#2 and update order X→Y.

| clock | FF | C#2:X→Y | | O#1 | O#2 | O#3 | O#4 |
|---|---|---|---|---|---|---|---|
| Clk1 | AV | X | | CP1 | CP1 | CE1 | CE1 |
| Clk2 | IV | | Y | CP2 | CE2 | CP2 | CE2 |
| Clk3 | AD | | Y | CE2 | CP2 | CE2 | CP2 |
| Clk4 | ID | X | | CE1 | CE1 | CP1 | CP1 |

Figure 5:
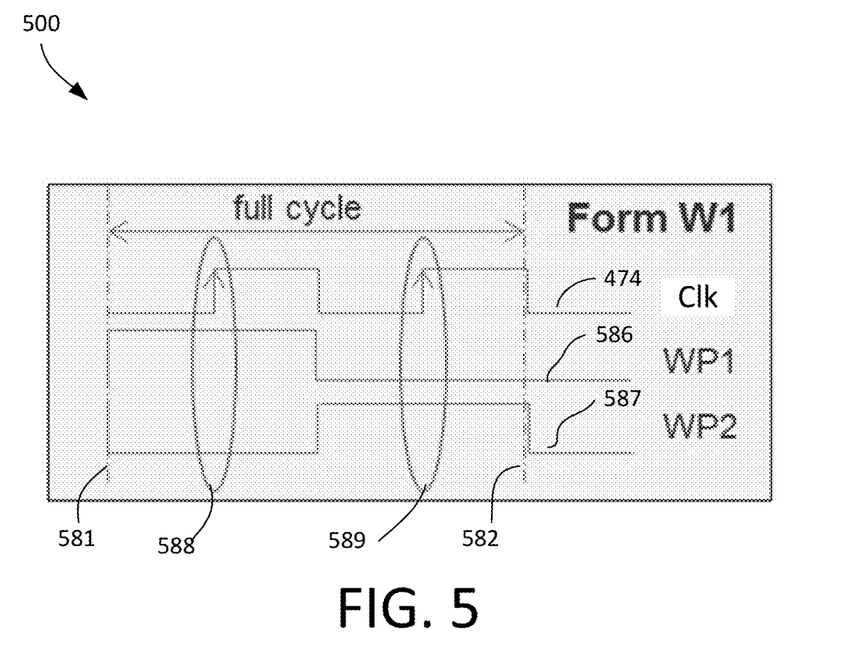
FIG. 5 is a timing diagram illustrating a first write pulse in accordance with at least one embodiment.

Writing of a new value is permissible with one of two possible write sequences, further denoted as write Form W1 and Form W2. FIG. 5 is a timing diagram illustrating a first write pulse in accordance with at least one embodiment. Within a full clock cycle beginning at time 581 and ending at time 582, sampling times 588 and 589 occur on rising edges of clock waveform 474 of clock signal Clk. At sampling time 588, first write pulse WP1 is at a high logic level, as shown by first write pulse waveform 586, and second write pulse WP2 is at a low logic level, as shown by second write pulse waveform 587. At sampling time 589, first write pulse WP1 is at a low logic level, as shown by first write pulse waveform 586, and second write pulse WP2 is at a high logic level, as shown by second write pulse waveform 587. Such a write pulse sequence 500 of write pulse logic levels is referred to as Form W1.

Figure 6:
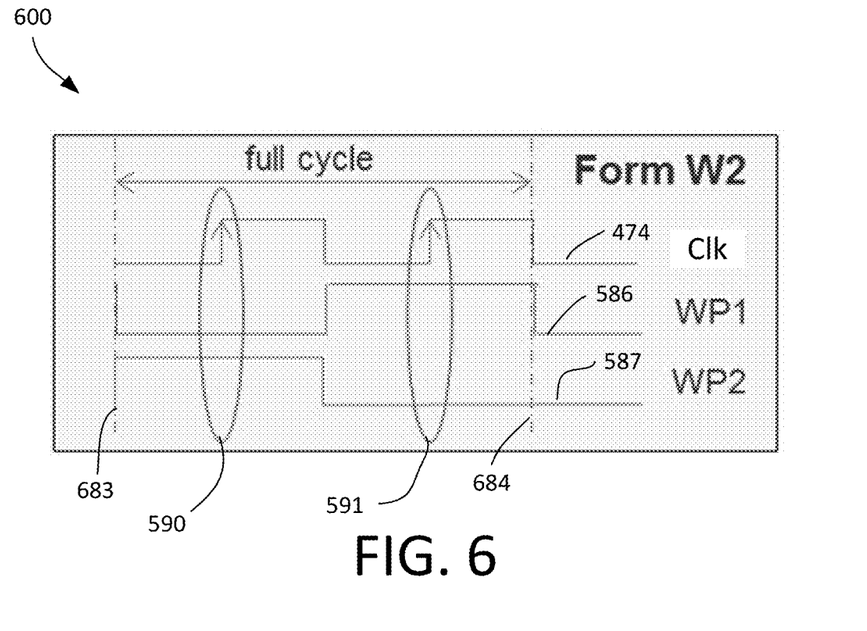
FIG. 6 is a timing diagram illustrating a second write pulse in accordance with at least one embodiment.

FIG. 6 is a timing diagram illustrating a second write pulse in accordance with at least one embodiment. Within a full clock cycle beginning at time 583 and ending at time 584, sampling times 590 and 591 occur on rising edges of clock waveform 474 of clock signal Clk. At sampling time 590, first write pulse WP1 is at a low logic level, as shown by first write pulse waveform 586, and second write pulse WP2 is at a high logic level, as shown by second write pulse waveform 587. At sampling time 591, first write pulse WP1 is at a high logic level, as shown by first write pulse waveform 586, and second write pulse WP2 is at a low logic level, as shown by second write pulse waveform 587. Such a write pulse sequence 600 of write pulse logic levels is referred to as Form W2.

Writing a new, valid value into the storage device requires some special considerations to avoid creating a loophole for security attacks. For this purpose a special write sequence is defined to achieve a valid result. The value to be written is provided in differential form at the signals In and (inverted) at Inb. Writing uses the write pulses WP1,WP2 to toggle differentially each in one half of the full cycle. Any partial write sequence that does not adhere to the above concept will result in the storage device entering the INVALID state (output 'Invalid' is asserted). This will be in particular the case when the values at In and Inb are not inverted when they get sampled into internal FF's, there is only a single write pulse, or both WP1 and WP2 are not inverted at sampling time, or the expected update sequence during a write operation is violated or not exactly met (e.g. due to concurrent tampering with the reset, voltages or the clock/derived clocks). As can be seen above there is temporal diversity (two update half cycles) paired with stringent differential update requirements on two pairs of signals, each using a different update scheme.

The permitted, valid write sequence is defined by combining the selected update sequence C#1/C#2, the update order X→Y/Y→X, regardless of the particular clocking scheme used. The correct write pulse WP1,WP2 need then to be selected for every FF according to Table 8 below:

TABLE 8

Clocking sequence, order, and write pulses

| Sequence | Order | C1 | C2 | AV | IV | AD | ID |
|---|---|---|---|---|---|---|---|
| C#1 | X→Y | AV + IV | AD + ID | WPj | WPj | WPk | WPk |
| C#1 | Y→X | AD + ID | AV + IV | WPk | WPk | WPj | WPj |
| C#2 | X→Y | AV + ID | AD + IV | WPj | WPk | WPk | WPj |
| C#2 | Y→X | AD + IV | AV + ID | WPk | WPj | WPj | WPk |

A mapping to update form is as follows:
Mapping for Form W1: WPj=WP1, WPk=WP2
Mapping for Form W2: WPj=WP2, WPk=WP1
C1,C2: refers to a particular half of the full cycle, as indicated in FIG. 4
AV,IF,AD,ID: refers the modified Flip-Flop that is modified in a particular time for every selected scheme.

Both input signals In and Inb are directly written into the respective FF. The signal In writes AV and AD, and (the inverted signal) Inb writes IV and ID. Any write is fully qualified with a check that validates the dual rail encoding of the input signals In and Inb, as well as the correctness of the write pulses WP1,WP2.

The above specifications results in any intermediate state to be one of the <Invalid status, write indeterminate> encodings of Table 4. Table 9 below shows only valid changes (any trivial change of a signal (same→same) change will not modify and thus not result in a change) for all updates sequences C#1,C#2 and orders X→Y/Y→X.

TABLE 9

Valid changes

| | Order | Before | C1 | C2 | Order | Before | C1 | C2 |
|---|---|---|---|---|---|---|---|---|
| C#1 | X→Y | 0101 | 1001 | 1010 | C#2 | X→Y | 0101 | 1100 | 1010 |
| | X→Y | 1010 | 0110 | 0101 | | X→Y | 1010 | 0011 | 0101 |
| | Y→X | 0101 | 0110 | 1010 | | Y→X | 0101 | 0011 | 1010 |
| | Y→X | 1010 | 1001 | 0101 | | Y→X | 1010 | 1100 | 0101 |

Any incomplete update sequence (e.g., stopping the clock, failing differential check, etc.) will result in an INVALID state. The WRITE&REPAIR logic selects the appropriate write value for every internal FF, which is then clocked into the FF with the corresponding clock. There are two options to implement such a behavior—either select the previous value or inhibits a write (i.e. via providing a CanWrite signal) when there is neither a write nor a repair needed.

The option implementing this behavior by selecting the previous value may be implemented using the following pseudo RTL code:
Repair=(VS xor IS)
Qualify=(WP1 xor WP2) and (In xor Inb)
always @posedge clkZ
if WPz
    Zin=(Qualify)? InZ: OutZ
else
    Zin=(Repair)? RepZ: OutZ
where InZ and OutZ, and ClkZ are the respective input and output, and clock signal for any of the internal FF's (AV, IV,AD,ID) and RepZ is the repaired value for the corresponding FF, in case this FF is identified as switching to a false value as indicated in Table 4.

The option implementing this behavior by using a CanWrite signal uses a similar pseudo RTL code:
Repair=(VS xor IS)
Qualify=(WP1 xor WP2) and (In xor Inb)
CanWrite=Qualify or Repair
always @ (CanWrite and ClkZ)
if WPz
    Zin=InZ
else
    Zin=RepZ
where InZ and ClkZ are the respective input and clock signal for any of the internal FF's (AV,IV,AD,ID) and RepZ is the repaired value for the corresponding FF, in case this FF is identified as switching to a false value as indicated in Table 4.

For both options, the Signal WPz relates to WP1 and/or WP2, as shown above in Table 8. Other selections are shown below in Tables 10 and 11.

TABLE 10

Signal selection

| FF | clkZ | OutZ | InZ | Zin |
|---|---|---|---|---|
| AV | clk1 | AV | In | AVin |
| IV | clk2 | IV | Inb | IVin |
| AD | clk3 | AD | In | Adin |
| ID | clk4 | ID | Inb | IDin |

TABLE 11

Selection of the RepZ signal:

| | | Condition | | | |
|---|---|---|---|---|---|
| FF | VS | IS | DS | True | False |
| AV | 0 | 1 | 0 | NOT AV | AV |
| IV | 1 | 0 | 0 | NOT IV | IV |
| AD | 0 | 1 | 1 | NOT AD | AD |
| ID | 1 | 0 | 1 | NOT ID | ID |

Figure 7:
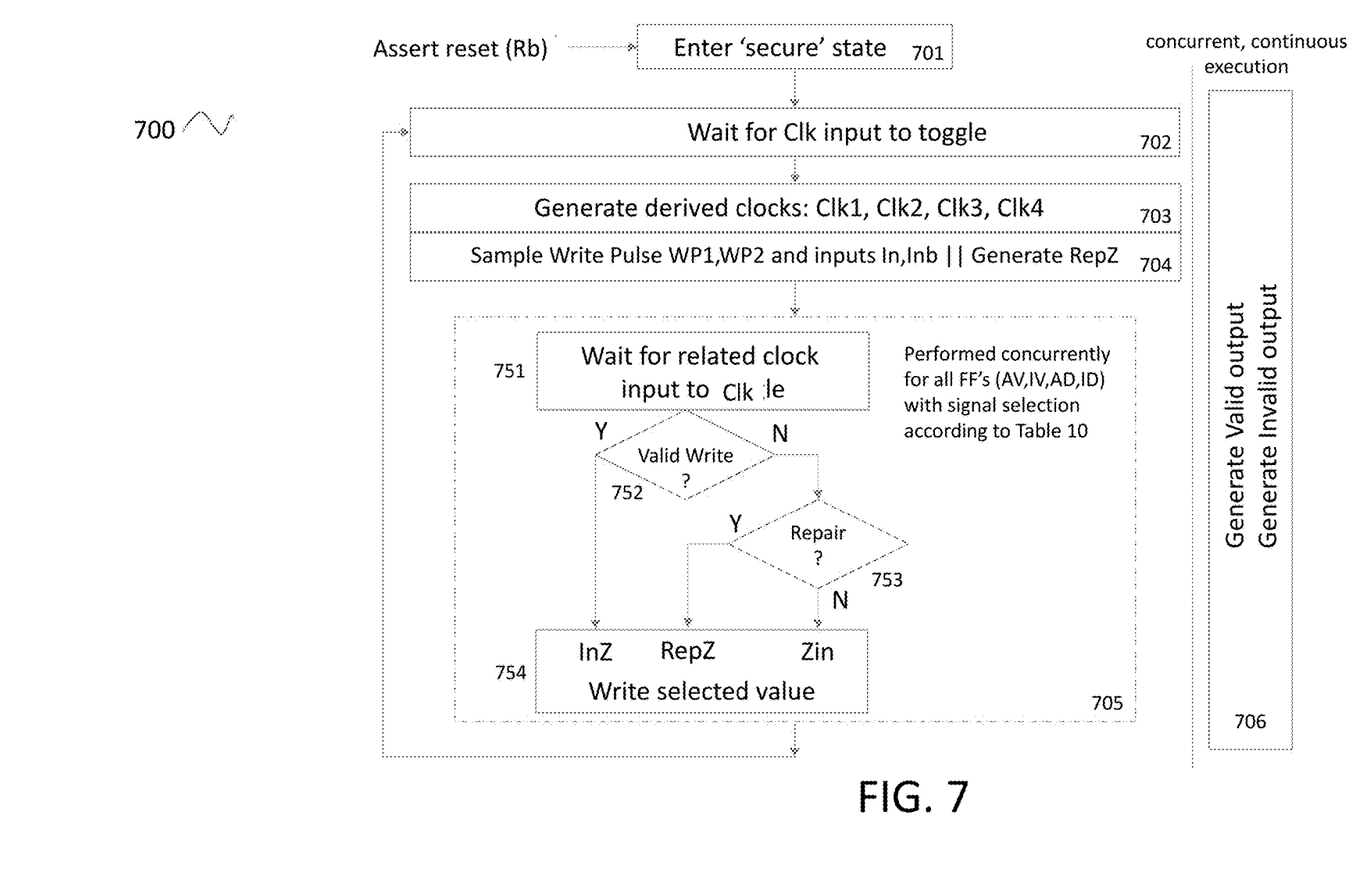
FIG. 7 is a flow diagram illustrating a method in accordance with at least one embodiment.

FIG. 7 is a flow diagram illustration a method in accordance with at least one embodiment, using the selection of a valid write as described above as an example. Processing begins after the assertion of the reset input 'Rb', which causes the bit storage device 100 to enter its "secure" state 701. It then waits in block 702 for the input clock Clk to toggle. Upon receipt of an input clock it generates the derived clocks Clk1,Clk2,Clk3, and Clk4 in block 703. In block 704 it samples the write pulses WP1,WP2 and the dual-rail input In,Inb. Concurrently the repair signal RepZ is calculated for every FF (AV,IV,AD,ID) according to Table 11. As usual in hardware the processing of block 703 and 704 may be performed sequentially or fully parallel.

The following processing in block 705 is replicated for every internal FF (AV,IV,AD,ID) and performed concurrently. In this block the corresponding FF waits in sub-block 751 for its related clock input (one of Clk1,Clk2,Clk3,Clk4) as shown in Table 6, 7 and 10 to toggle. When a valid write operation is detected in sub-block 752 by evaluating the write pulses WP1,WP2 and the dual-rail input In,Inb, it selects the corresponding input InZ as write data; otherwise it is checked whether a repair operation is required in sub-block 753. When a repair is needed, the corresponding repair signal RepZ is selected as shown in Table 11, otherwise the original signal Zin is selected. The actually selected value is then written in sub-block 754. This write operation also results in the generation of the corresponding output OutZ. After this, the processing repeats with step 702 waiting for a new clock cycle of the input clock Clk. Concurrently to the operations described before, both the Valid and the Invalid output of the bit storage device are calculated in block 706. This is a continuous operation that occurs instantly upon updating one of the internal FF's, which ensures also a correct reflection of the validity of the outputs OutZ in case the stored values within one of the FF's would be compromised by an environmental influence, like e.g. radiation.

Figure 8:
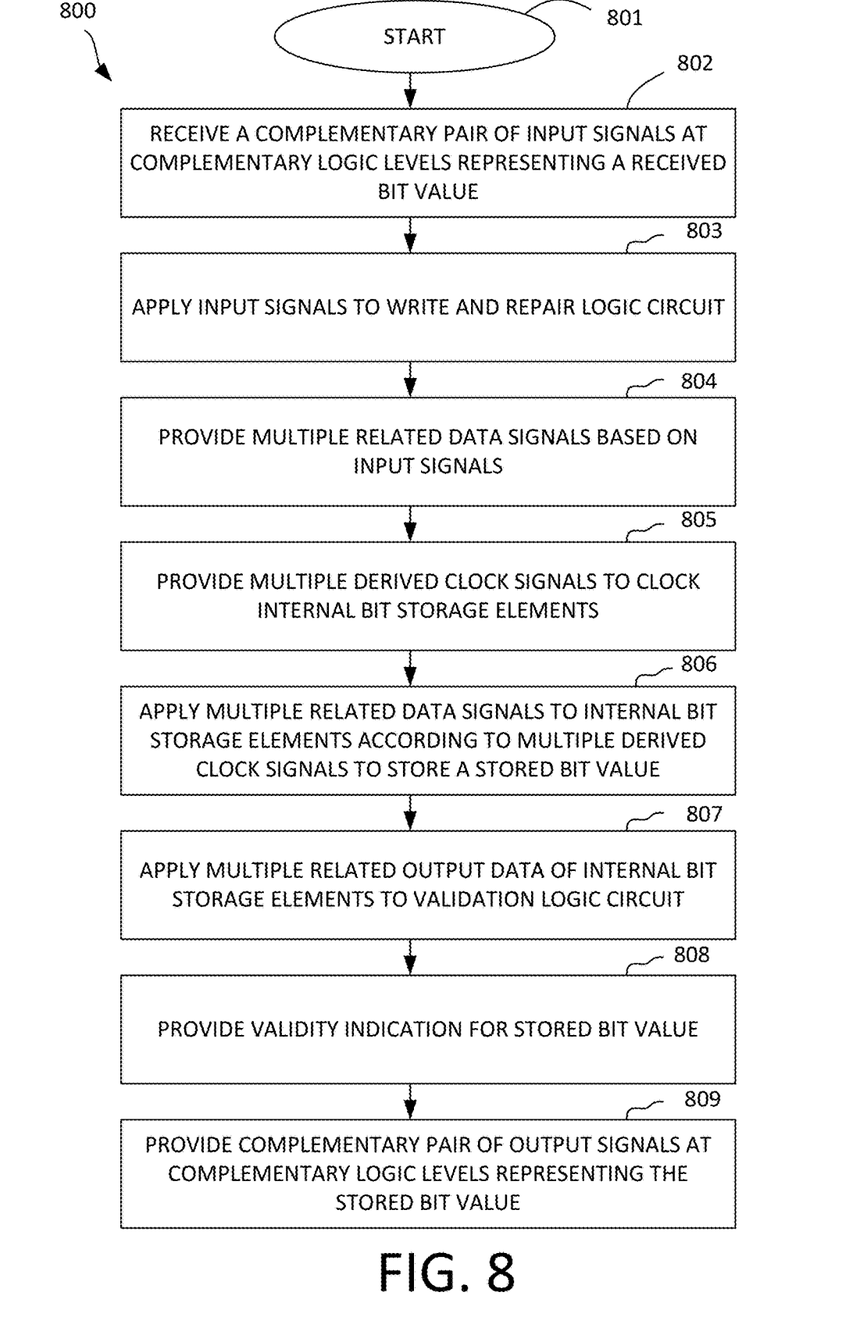
FIG. 8 is a flow diagram illustrating a method in accordance with at least one embodiment.

FIG. 8 is a flow diagram illustrating a method in accordance with at least one embodiment. Method 800 begins in block 801 and continues to block 802. In block 802, a complementary pair of input signals at complementary logic levels representing a received bit value are received on complementary input lines of a bit storage device. While the complementary logic levels are indeed complementary, with one having a logic level representing a binary zero and the other having a logic level representing a binary one, for input values with proper dual rail encoding, what should properly be complementary logic levels can, for an erroneous input, both be of the same logic level. Detection of such erroneous input is provided, and such erroneous input can be prevented from improperly altering a stored bit value stored in the bit storage device. From block 802, method 800 continues to block 803. In block 803, the input signals are applied to a write and repair logic circuit. The input signals from block 802 can be applied to write and repair logic circuit, for example, when the bit value stored in the bit storage device is to be updated with a new value. At other times, for example, when no new value is to be stored, output values at outputs of registers within the bit storage device can be provided as input signals to the write and repair logic circuit to allow, for example, rewriting an existing value already stored in the bit storage device. Optionally, both input signals from block 802 and other input signals from output values at outputs of the registers can be provided to the write and repair logic circuit, and the write and repair logic circuit can select or ignore the input signals or the other input signals based on values of write pulse line values provided to write and repair logic circuit 803. From block 803, method 800 continues to block 804. In block 804, multiple related data signals based on the input signals are provided. As examples, the multiple related data signals can comprise an actual value, an inverse value, a differential actual value, and a differential inverse value. Optionally, one of these signals may be altered before provision by the write and repair logic, to perform a correction of an erroneous value recorded by one of the internal bit storage elements. From block 804, method 800 continues to block 805. In block 805, multiple clock signals derived from the provided clock input are provided to provide clocking of internal bit storage elements. From block 805, method 800 continues to block 806. As examples, a first derived clock signal can be provided to an actual value internal bit storage element, a second derived clock signal can be provided to an inverse value internal bit storage element, a third derived clock signal can be provided to a differential actual value internal bit storage element, and a fourth derived value clock signal can be provided to a differential inverse value internal bit storage element. The timing (e.g., phase) of the first derived clock signal can be the same as that of either the second derived clock signal or the fourth derived clock signal, and the timing (e.g., phase) of the third derived clock signal can be the same as that of an opposite of whichever of the second derived clock signal and the fourth derived clock signal has the same timing (e.g., phase) as the actual value clock signal.

In block 806, multiple related data signals are applied to internal bit storage elements according to multiple derived clock signals to store a stored bit value. As examples, the actual value may be provided to an actual value internal bit storage element, the inverse value may be provided to an inverse value internal bit storage element, the differential actual value may be provided to a differential actual value internal bit storage element, and the differential inverse value may be provided to a differential inverse value internal bit storage element. From block 806, method 800 continues to block 807. In block 807, multiple related output data of internal bit storage elements are applied to a validation logic circuit. For example, output values from each of the actual value internal bit storage element, the inverse value internal bit storage element, the differential actual value internal bit storage element, and the differential inverse value internal bit storage element can be provided to the validation logic circuit. In accordance with one embodiment, the output values can be provided via additional logic circuitry, for example, logic circuitry functioning as XNOR gates to perform XNOR functions on combinations of the output values. From block 807, method 800 continues to block 808. In block 808, a validity indication for the stored bit value is provided. The validity indication can include at least one of a validity output value and an invalidity output value. If both the validity output value and the invalidity output value are provided, combinations of such values can represent, for example, validity of a stored bit value of the bit storage device, invalidity of the stored bit value of the bit storage device, and an indeterminate state of the stored bit value of the bit storage device. An example of the indeterminate state can arise when a correctable bit error is encountered, or during a multi-phase write operation. From block 808, method 800 continues to block 809. In block 809, a complementary pair of output signals is provided at complementary logic levels to represent the stored bit value. The complementary pair of output signals can be dual rail encoded. One of the complementary pair of output signals can represent an actual output value, and the other of the complementary pair of output signals can represent an inverse output value, the inverse output value being the logical inverse of the actual output value.

At least one embodiment provides correction capabilities and signaling that there is an intermediate invalid state due to an ongoing repair function. A bit flip of AV, AD, IV, ID (one bit at a time) indicates all such bit flips are to be repaired (with temporary de-assertion of the Valid signal to flag an inconsistent state). Concurrent bit flip of more than one internal flip flop are NOT to be repaired and cause the Valid signal to be de-asserted and the Invalid signal is to be asserted.

At least one embodiment provides signaling that there is an intermediate invalid state due to an ongoing write operation. During a valid write operation, the Valid signal is de-asserted during the first half of the write sequence to ensure stopping at an intermediate state cannot be used as an attack vector.

At least one embodiment provides signaling that there is an incorrect or incomplete write operation. In the event a bit value to be stored is not correctly dual-rail encoded, the write operation is suppressed. In the event a bit value to be stored is modified during the write sequence, an invalid state is entered and flagged by asserting Invalid. In the event a valid second half of a write operation does not immediately follow a valid first half of a write operation, an invalid state is entered and flagged by asserting Invalid.

At least one embodiment provides a tamper-resistant, error-correcting bit storage device that can replace a basic storage element (e.g. a flip flop) to provide stability against known security attacks and which can be used to hold essential decision criteria. An error correction capability that is similar to a Triple-Voting Flop (TVF) can provide improved reliability, which can be useful, for example, for safety applications.

In accordance with at least one embodiment, a bit storage device comprises a first register including a first output, the first register configured to store an actual value and the first output configured to provide a first output value, a second register including a second output, the second register configured to store an inverse value (e.g., an inverted actual value), wherein a second output value at the second output of the second register is inverse to (e.g., complementary to) a first output value at the first output of the first register, a third register including a third output, the third register configured to store a differential actual value, a fourth register including a fourth output, the fourth register configured to store a differential inverse value, wherein the differential inverse value at the fourth output is inverted relative to the differential actual value at the third output of the third register, a validation circuit including a first validation input coupled to the first output of the first register, a second validation input coupled to the second output of the second register, a third validation input coupled to the third output of the third register, a fourth validation input coupled to the fourth output of the fourth register, and a validity output to provide a validity indication, and a write circuit having a first write circuit input coupled to the first register, a second write circuit input coupled to the second register, a third write circuit input couple to the third register, and a fourth write circuit input coupled to the fourth register. The write circuit is configured to cause, at a first clock edge, the first register to store the actual value and a first other storage operation selected from a first group consisting of the second register being caused to store the inverse value and the fourth register being caused to store the differential inverse value, the write circuit configured to cause, at a second clock edge, the third register to store the differential actual value and a second other storage operation selected from a second group consisting of the second register being caused to store the inverse value and the fourth register being caused to store the differential inverse value. The second other storage operation is performed on a different register than the first other storage operation.

In accordance with at least one embodiment, the write circuit is further configured to receive the output values of the first, second, third, and fourth register, to determine a correctable error of an erroneous one of the first, second, third, and fourth registers, and to provide a corrected value as the actual value to the erroneous register to correct the correctable error. In accordance with at least one embodiment, the bit storage device provides continuous error correction operable to prevent error accumulation. In accordance with at least one embodiment, a first instance of the first other storage operation comprises causing the first register to store the actual value and the first other storage operation consisting of the second register being caused to store the inverse value, and a second instance of the first other storage operation comprises causing the first register to store the actual value and the first other storage operation consisting of the fourth register being caused to store the differential inverse value. In accordance with at least one embodiment, only two of sixteen combinations of the first output value of the first register, the second output value of the second register, the third output value of the third register, and the fourth output value of the fourth register correspond to valid bit storage values; where the two of the sixteen combinations have a maximum possible Hamming distance within the sixteen combinations. In accordance with at least one embodiment, two of the sixteen combinations of the output values of the first, second, third, and fourth registers comprise output values of the first, second, third, and fourth registers having an identical value and correspond to an invalid encoding that can neither be corrected nor modified to a correct combination with an operation other than a reset operation or a valid write sequence. In accordance with at least one embodiment, correctable bit combinations of values at outputs of the first, second, third, and fourth registers consist of combinations having a Hamming distance of one from either of two valid combinations. In accordance with at least one embodiment, the write circuit receives, as input of the bit storage device, a dual rail encoded input line comprising a non-inverted input line and an inverted input line, wherein the write circuit receives two write pulse inputs, wherein the actual value for the first register and the differential actual value for the third register are derived from the non-inverted input line, and the inverse value for the second register and the differential inverse value for the fourth register are derived from the inverted input line when a correct write operation is indicated by the two write pulse inputs. In accordance with at least one embodiment, the correct write operation is indicated by inverse encoded write pulse inputs at the two write pulse inputs. In accordance with at least one embodiment, the first clock edge and the second clock edge are obtained from clock signals generated within the bit storage device. In accordance with at least one embodiment, the validation circuit provides an asserted validity indication when the first output value of the first register, the second output value of the second register, the third output value of the third register, and the fourth output value of the fourth register correspond to either of two combinations representing a valid bit storage.

In accordance with at least one embodiment, a method comprises receiving an actual value at an actual value input and an inverse value at an inverse value input, storing in a first register, at a first clock edge, the actual value and performing, at the first clock edge, a first other storage operation selected from a first group consisting of storing the inverse value in a second register and storing a differential inverse value in a fourth register, storing in a third register, at the second clock edge offset in time from the first clock edge, the differential actual value and performing, at the second clock edge, a second other storage operation selected from a second group consisting of storing the inverse value in the second register and storing the differential inverse value in the fourth register, wherein the second other storage operation is performed on a different register than the first other storage operation. In accordance with at least one embodiment, the method further comprises determining, from the output values of the first, second, third, and fourth registers, a correctable error of an erroneous one of the first, second, third, and fourth registers and writing a correct value to the erroneous one to correct the correctable error. In accordance with at least one embodiment, a first instance of the performing the first other storage operation consists of storing the inverse value in the second register, and wherein a second instance of the performing the first other storage operation consists of storing the differential inverse value in the fourth register. In accordance with at least one embodiment, only two of the sixteen combinations of the output values of the first, second, third, and fourth register correspond to valid bit storage values. In accordance with at least one embodiment, the method further comprises receiving, as input, redundant input lines comprising a non-inverted input line and an inverted input line and providing, as output, redundant output lines comprising a non-inverted output line and an inverted output line. In accordance with at least one embodiment, the method further comprises obtaining the first clock edge and the second clock edge from internally generated clock signals.

In accordance with at least one embodiment, an integrated circuit (IC) comprises a first register including a first output, the first register configured to store an actual value, the first output configured to provide a first output value, a second register including a second output, the second register configured to store an inverse value, wherein the inverse value is inverse to (e.g., complementary to) the actual value, the second output configured to provide a second output value, a third register including a third output, the third register configured to store a differential actual value, a fourth register including a fourth output, the fourth register configured to store a differential inverse value, wherein the differential inverse value is inverted relative to the differential actual value, a validation circuit including a first validation input coupled to the first output of the first register, a second validation input coupled to the second output of the second register, a third validation input coupled to the third output of the third register, and a fourth validation input coupled to the fourth output of the fourth register, and a validity output to provide a validity indication based on output values received from the first, second, third, and fourth registers, and a write circuit having a first write circuit input coupled to the first register, a second write circuit input coupled to the second register, a third write circuit input coupled to the third register, and a fourth write circuit input coupled to the fourth register, the write circuit configured to cause, at a first clock edge, the first register to store the actual value and a first other storage operation selected from a first group consisting of the second register being caused to store the inverse value and the fourth register being caused to store the differential inverse value, the write circuit configured to cause, at a second clock edge, the third register to store the differential actual value and a second other storage operation selected from a second group consisting of the second register being caused to store the inverse value and the fourth register being caused to store the differential inverse value, wherein the second other storage operation is performed on a different register than the first other storage operation.

In accordance with at least one embodiment, the integrated circuit provides continuous error correction operable to prevent error accumulation. In accordance with at least one embodiment, a first instance of the first other storage operation comprises causing the second register to store the inverse value, and a second instance of the first other storage operation comprises causing the fourth register to store the differential inverse value.

What is claimed is:

1. A bit storage device comprising:
a first register including a first output, the first register configured to store an actual value and the first output configured to provide a first output value;
a second register including a second output, the second register configured to store an inverse value, wherein a second output value at the second output of the second register is inverse to a first output value at the first output of the first register;
a third register including a third output, the third register configured to store a differential actual value;
a fourth register including a fourth output, the fourth register configured to store a differential inverse value, wherein the differential inverse value at the fourth output is inverted relative to the differential actual value at the third output of the third register;
a validation circuit including a first validation input coupled to the first output of the first register, a second validation input coupled to the second output of the second register, a third validation input coupled to the third output of the third register, a fourth validation input coupled to the fourth output of the fourth register, and a validity output to provide a validity indication; and
a write circuit having a first write circuit input coupled to the first register, a second write circuit input coupled to the second register, a third write circuit input couple to the third register, and a fourth write circuit input coupled to the fourth register, the write circuit configured to cause, at a first clock edge, the first register to store the actual value and a first other storage operation selected from a first group consisting of the second register being caused to store the inverse value and the fourth register being caused to store the differential inverse value, the write circuit configured to cause, at a second clock edge, the third register to store the differential actual value and a second other storage operation selected from a second group consisting of the second register being caused to store the inverse value and the fourth register being caused to store the differential inverse value, wherein the second other storage operation is performed on a different register than the first other storage operation.

2. The bit storage device of claim 1 wherein the write circuit is further configured to receive the output values of the first, second, third, and fourth register, to determine a correctable error of an erroneous one of the first, second, third, and fourth registers, and to provide a corrected value as the actual value to the erroneous register to correct the correctable error.

3. The bit storage device of claim 1 wherein the bit storage device provides continuous error correction operable to prevent error accumulation.

4. The bit storage device of claim 1 wherein a first instance of the first other storage operation comprises causing the first register to store the actual value and the first other storage operation consisting of the second register being caused to store the inverse value, and wherein a second instance of the first other storage operation comprises causing the first register to store the actual value and the first other storage operation consisting of the fourth register being caused to store the differential inverse value.

5. The bit storage device of claim 1 wherein only two of sixteen combinations of the first output value of the first register, the second output value of the second register, the third output value of the third register, and the fourth output value of the fourth register correspond to valid bit storage values; where the two of the sixteen combinations have a maximum possible Hamming distance within the sixteen combinations.

6. The bit storage device of claim 1 wherein two of the sixteen combinations of the output values of the first, second, third, and fourth registers comprise output values of the first, second, third, and fourth registers having an identical value and correspond to an invalid encoding that can neither be corrected nor modified to a correct combination with an operation other than a reset operation or a valid write sequence.

7. The bit storage device of claim 1 wherein correctable bit combinations of values at outputs of the first, second, third, and fourth registers consist of combinations having a Hamming distance of one from either of two valid combinations.

8. The bit storage device of claim 1 wherein the write circuit receives, as input of the bit storage device, a dual rail encoded input line comprising a non-inverted input line and an inverted input line, wherein the write circuit receives two write pulse inputs, wherein the actual value for the first register and the differential actual value for the third register are derived from the non-inverted input line, and the inverse value for the second register and the differential inverse value for the fourth register are derived from the inverted input line when a correct write operation is indicated by the two write pulse inputs.

9. The bit storage device of claim 8 wherein the correct write operation is indicated by inverse encoded write pulse inputs at the two write pulse inputs.

10. The bit storage device of claim 1 wherein the first clock edge and the second clock edge are obtained from clock signals generated within the bit storage device.

11. The bit storage device of claim 1 wherein the validation circuit provides an asserted validity indication when the first output value of the first register, the second output value of the second register, the third output value of the third register, and the fourth output value of the fourth register correspond to either of two combinations representing a valid bit storage.

12. A method comprising:
receiving an actual value at an actual value input and an inverse value at an inverse value input;
at a first clock edge, storing in a first register the actual value and performing a first other storage operation selected from a first group consisting of storing the inverse value in a second register and storing a differential inverse value in a fourth register;
at a second clock edge offset in time from the first clock edge, storing in a third register the differential actual value and performing a second other storage operation selected from a second group consisting of storing the inverse value in the second register and storing the differential inverse value in the fourth register, wherein the second other storage operation is performed on a different register than the first other storage operation.

13. The method of claim 12 further comprising:
determining, from the output values of the first, second, third, and fourth registers, a correctable error of an erroneous one of the first, second, third, and fourth registers; and
writing a correct value to the erroneous one to correct the correctable error.

14. The method of claim 12 wherein a first instance of the performing the first other storage operation consists of storing the inverse value in the second register, and wherein a second instance of the performing the first other storage operation consists of storing the differential inverse value in the fourth register.

15. The method of claim 12 wherein only two of the sixteen combinations of the output values of the first, second, third, and fourth register correspond to valid bit storage values.

16. The method of claim 12 further comprising:
receiving, as input, redundant input lines comprising a non-inverted input line and an inverted input line; and
providing, as output, redundant output lines comprising a non-inverted output line and an inverted output line.

17. The method of claim 12 further comprising:
obtaining the first clock edge and the second clock edge from internally generated clock signals.

18. An integrated circuit (IC) comprising:
a first register including a first output, the first register configured to store an actual value, the first output configured to provide a first output value;
a second register including a second output, the second register configured to store an inverse value, wherein the inverse value is inverse to the actual value, the second output configured to provide a second output value;
a third register including a third output, the third register configured to store a differential actual value;
a fourth register including a fourth output, the fourth register configured to store a differential inverse value, wherein the differential inverse value is inverted relative to the differential actual value;
a validation circuit including a first validation input coupled to the first output of the first register, a second validation input coupled to the second output of the second register, a third validation input coupled to the third output of the third register, and a fourth validation input coupled to the fourth output of the fourth register, and a validity output to provide a validity indication based on output values received from the first, second, third, and fourth registers; and
a write circuit having a first write circuit input coupled to the first register, a second write circuit input coupled to the second register, a third write circuit input coupled to the third register, and a fourth write circuit input coupled to the fourth register, the write circuit configured to cause, at a first clock edge, the first register to store the actual value and a first other storage operation selected from a first group consisting of the second register being caused to store the inverse value and the fourth register being caused to store the differential inverse value, the write circuit configured to cause, at a second clock edge, the third register to store the differential actual value and a second other storage operation selected from a second group consisting of the second register being caused to store the inverse value and the fourth register being caused to store the differential inverse value, wherein the second other storage operation is performed on a different register than the first other storage operation.

19. The integrated circuit of claim 18 wherein the integrated circuit provides continuous error correction operable to prevent error accumulation.

20. The integrated circuit of claim 18 wherein a first instance of the first other storage operation comprises causing the second register to store the inverse value, and wherein a second instance of the first other storage operation comprises causing the fourth register to store the differential inverse value.

* * * * *